(12) United States Patent
Chen et al.

(10) Patent No.: US 6,426,285 B1
(45) Date of Patent: Jul. 30, 2002

(54) METHOD TO SOLVE INTERMETALLIC DIELECTRIC CRACKS IN INTEGRATED CIRCUIT DEVICES

(75) Inventors: Chin-Tsai Chen, Taipei; Chao-Ray Wang, Hsin-Chu, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/433,054

(22) Filed: Nov. 3, 1999

(51) Int. Cl.[7] .................................... H01L 21/4763
(52) U.S. Cl. ................ 438/624; 438/631; 438/787; 438/788; 438/789; 438/790
(58) Field of Search ................ 438/624, 631, 438/787, 788, 789, 790

(56) References Cited

U.S. PATENT DOCUMENTS

| | | | |
|---|---|---|---|
| 3,862,852 A | 1/1975 | Kamins | 117/106 A |
| 4,581,814 A | 4/1986 | Cellar et al. | 29/576 W |
| 4,631,804 A | 12/1986 | Roy | 29/576 W |
| 4,830,984 A | 5/1989 | Purdes | 437/126 |
| 5,650,359 A * | 7/1997 | Ahlburn | 438/789 |
| 5,856,230 A | 1/1999 | Jang | 438/439 |
| 5,953,635 A * | 9/1999 | Andideh | 438/624 |
| 6,139,923 A * | 10/2000 | Gupta | 438/788 |
| 6,174,808 B1 * | 1/2001 | Jang et al. | 438/787 |
| 6,191,050 B1 * | 2/2001 | Andideh | 438/787 |
| 6,291,331 B1 * | 9/2001 | Wang et al. | 438/624 |
| 2001/0000012 A1 * | 3/2001 | Andideh | 257/760 |

FOREIGN PATENT DOCUMENTS

JP   404152656 A * 5/1992 ........ 438/FOR 355

* cited by examiner

Primary Examiner—John F. Niebling
Assistant Examiner—Lynne A. Gurley
(74) Attorney, Agent, or Firm—George O. Saile; Stephen B. Ackerman

(57) ABSTRACT

A process for forming a composite intermetal dielectric, (IMD), layer, with reduced tensile stress, eliminating defects that can be induced by highly stressed, IMD layers, to underlying dielectric layers, and metal interconnect structures, has been developed. The process features the use of a capping, or overlying, silicon oxide component, obtained via PECVD procedures, using TEOS as a source, and using a set of power, and frequency conditions, resulting in a high compressive stress for the capping silicon oxide layer. The high compressive stress of the capping silicon oxide layer, balances the high tensile stress, inherent in an underlying silicon oxide component, of the composite IMD layer, eliminating stress related defects to underlying dielectric layers, and to underlying metal interconnect structures.

12 Claims, 2 Drawing Sheets

| Table 1 IMD Stress as a Function of Oxide Deposition Conditions | |
|---|---|
| Sample | Stress |
| A - IMD1<br>PE-Silane Oxide<br>(1000 A°) | -1.0 E8 dynes/cm² |
| B - IMD2<br>SA CVD Oxide<br>(4000 A°) | 3.8 E9 dynes/cm² |
| C - IMD3 (conventional)<br>PETEOS Oxide<br>(18000 A°) | -1.0E9 dynes/cm² |
| D - IMD3 (Invention)<br>PETEOS Oxide<br>(18000 A°) | -2.5E9 dynes/cm² |

*FIG. 4*

METHOD TO SOLVE INTERMETALLIC DIELECTRIC CRACKS IN INTEGRATED CIRCUIT DEVICES

BACKGROUND OF THE INVENTION (1) Field of the Invention

The present invention relates to methods used to fabricate semiconductor devices, and more specifically to a method used to form a composite intermetal dielectric, (IMD), layer, which exhibits low stress on underlying metal and dielectric structures, located on a semiconductor substrate.

(2) Description of the Prior Art

Intermetal dielectric, (IMD), layers have been used in the semiconductor industry to passivate underlying metal interconnect structures, as well as to provide isolation of these same metal interconnect structures. Low k dielectric layers, such as hydrogen silsesquioxane, (HSQ), and fluorinated silicon oxide glass, (FSG), have provided the desired passivation, and isolation characteristics, as well as offering decreased capacitances, when compared to higher k dielectric layers, such as silicon oxide. However the superior passivation characteristics of silicon oxide layers, such as minimum leakage, and high dielectric breakdown strengths, still make it an attractive candidate for IMD purposes, when compared to the lower k dielectric layer counterparts.

One problem still encountered with IMD layers, comprised with chemically vapor deposited, (CVD), silicon oxide layers, is the inherent stress of these layers, and the damage these stresses can place on underlying elements of the semiconductor device. For example an IMD layer, can be a composite IMD layer, comprised of: an underlying layer, or a IMD-1 component, such as a plasma enhanced silicon oxide layer, formed using silane as a source, an IMD-2 component, featuring a sub-atmospheric, chemically vapor deposited, (SACVD), silicon oxide layer, and an overlying, capping, plasma enhanced silicon oxide layer, (IMD-3), component, formed using tetraethylorthosilicate, (TEOS), as source. The IMD-2 component, in this case SACVD silicon oxide, which is needed to provide the desired leakage and dielectric breakdown characteristics, inherently is comprised with a high tensile stress, which induces unwanted concave or bowing up, of the underlying semiconductor substrate. This type of bowing can result in cracking of underlying insulator layers, as well as disruptions, or opens, in underlying metal interconnect patterns. The capping dielectric layer, or the IMD-3, component, formed from plasma enhanced chemical vapor deposition, using TEOS sa a source, inherently is comprised with a compressive stress, which supplies a convex, or bowing down effect, on the underlying semiconductor, and it's elements. However the degree of compressive stress, provided by the IMD-3, PETEOS silicon oxide layer, formed using conventional deposition conditions, may not be sufficient to overcome the high tensile stress of the IMD-2, SACVD silicon oxide component, therefore still risking deleterious concave, or bowing up, effects.

This invention will teach a process for formation of PETEOS silicon oxide layers, in which the compressive stress of the layer is increased, when compared to counterpart, PETEOS silicon oxide layers, formed using conventional deposition conditions, or formed using a set of conditions, different than the deposition parameters described in this invention. The PETEOS layer, described in this invention, and used as the IMD-3 component, provides the level of compressive stress needed to balance the tensile stress of the IMD-2 component, resulting in a composite IMD layer, providing little, unwanted, tensile stress, and bowing up phenomena, of underlying elements. Prior art, such as Roy, in U.S. Pat. No. 4,631,804, Jang, in U.S. Pat. No. 5,856,230, and Purdes, in U.S. Pat. No. 4,830,984, show methods of reducing stress, and semiconductor wafer warpage, by addressing the process conditions used to form polysilicon and epitaxial silicon layers, as well as addressing the conditions used to form field oxide isolation regions. However none of these prior arts describe the novel procedure, taught in this invention, featuring a unique set of deposition conditions, used to form a PETEOS silicon oxide layer, with high compressive stress, used as a component of a composite IMD layer.

SUMMARY OF THE INVENTION

It is an object of this invention to form a composite IMD layer, to overlay, and passivate, underlying metal interconnect structures.

It is another object of this invention to form a composite IMD layer, in which the tensile stress of the composite IMD layer is reduced to a level in which a concave bend, or bowing up, of the semiconductor substrate, and the elements located on the semiconductor substrate, is eliminated.

It is another object of this invention to use a PETEOS silicon oxide layer, as a capping layer, or as a component of the composite IMD layer, where the PETEOS silicon oxide layer is formed using deposition conditions which allow the PETEOS silicon oxide layer to feature a high compressive stress, at a level needed to balance the tensile stress, inherent in an underlying component of the composite IMD layer.

In accordance with the present invention a method of forming a composite IMD layer, featuring a capping, PETEOS silicon oxide layer, comprised with a high compressive stress, and used to balance the tensile stress of underlying components of the composite IMD layer, is described. After formation of metal interconnect structures, communicating with underlying conductive regions, either on, or in a semiconductor substrate, an underlying component, (IMD-1), comprised of a thin PECVD silicon oxide layer, formed using silane as a reactant, is deposited, conformally coating the underlying metal interconnect structures. A second component of the composite IMD layer, (IMD-2), comprised of a sub-atmospheric chemically vapor deposited, (SACVD), silicon oxide layer, comprising a high tensile stress, is deposited overlying IMD-1. A third silicon oxide component, (IMD-3), of the composite IMD layer, is next formed via PECVD procedure, using TEOS as a source. The PETEOS silicon oxide component is formed using specific power and frequency deposition conditions, needed to obtain an IMD-3 silicon oxide layer, with a high compressive stress, neutralizing, or balancing the tensile stress, contained in the IMD-2 silicon oxide component, thus resulting in a composite IMD layer that does not warp or bend the semiconductor substrate due to tensile stresses.

BRIEF DESCRIPTION OF THE DRAWINGS

The object and other advantages of this invention are best described in the preferred embodiments with reference to the attached drawings, and tables, that include:

FIG. 4 showing the stress of the various components of the composite IMD layer.

DESCRIPTION OF THE PREFERRED EMBODIMENTS

Figure 1:
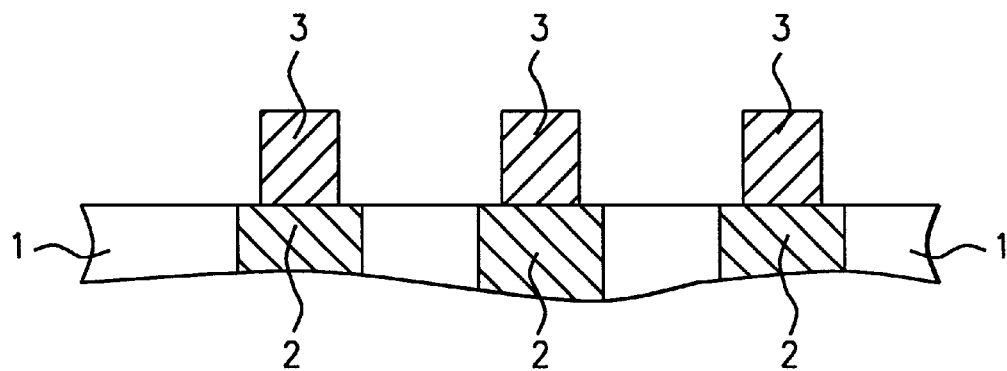
FIGS. 1–3, which schematically, in cross-sectional style, describe the key stages of fabrication, used to form the composite IMD layer, featuring a capping, silicon oxide layer, formed using deposition conditions that result in a high compressive stress, needed to balance the tensile stress contained in underlying silicon oxide components of the composite IMD layer.

The method of forming a composite IMD layer, featuring a capping, silicon oxide layer, with a high compressive stress, needed to balance the tensile stress of underlying silicon oxide components, of the composite IMD layer, will now be described in detail. Conductive regions 2, comprised of either metal plugs, or lower level metal interconnect structures, formed from a conductive material chosen from a group that includes, aluminum, tungsten, tungsten silicide, or copper, is shown schematically in FIG. 1, encased, via a damascene type procedure, in insulator layer 1, which can be comprised of either silicon oxide, or borophosphosilicate glass. Conductive regions 2, can also be active device regions, such as source/drain regions, located in a semiconductor substrate. Metal interconnect structures 3, shown schematically in FIG. 1, comprised of a metal chosen from a group that contains aluminum, aluminum -copper, tungsten or copper, are next formed, overlying, and contacting, conductive regions 1. Metal interconnect structures 3, are formed via conventional deposition and patterning procedures.

Figure 2:
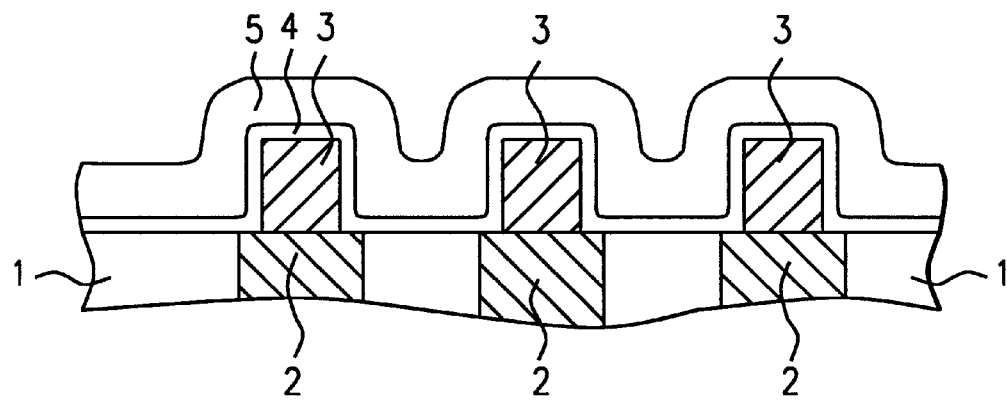

A first component of a composite IMD layer, IMD-1, is next deposited, conformally contouring underlying metal interconnect structures 3. IMD-1, or silicon oxide layer 4, schematically shown in FIG. 2, is deposited via plasma enhanced chemical vapor deposition, (PECVD), procedures, to a thickness between about 750 to 1250 Angstroms, at a temperature between about 350 to 450° C., using silane and nitrous oxide, as reactants, or tetraethylorthosihcate, (TEOS), as a source. Thin silicon oxide layer 4, or IMD-1 component, deposited using the above reactants, results in excellent coverage of the underlying metal interconnect structures, and is formed with a low compressive stress of about $-0.5$ to $-1.5E8$ dynes/cm$^2$. A second component of a composite IMD layer, IMD-2, is then deposited using sub-atmospheric chemical vapor deposition, (SACVD), procedures, resulting in silicon oxide layer 5, shown schematically in FIG. 2. The SACVD layer presents excellent step coverage properties, allowing gap filling of intermetallic spacings to be easily accomplished. Silicon oxide layer 5, formed at a thickness between about 3500 to 4500 Angstroms, at a deposition temperature between about 350 to 450° C., using TEOS as a source, is comprised with a high tensile stress, between about 3.5 to 4.5E9 dynes/cm$^2$. The high tensile stress, contained in silicon oxide layer 5, can during subsequent processing procedures, result in warpage, or a concave or bowing up, of the underlying semiconductor substrate.

The phenomena of bowing up, can crack or damage dielectric layers, as well as interrupt the continuity of metal interconnect structures, resulting in yield or reliability problems. Therefore an overlying, or capping, silicon oxide layer, formed with a high compressive stress, is needed to balance the tensile stress supplied by underlying silicon oxide layer 5. A silicon oxide layer or or IMD-3, is deposited using conventional PECVD procedures, using tetraethylorthosilicate, (TEOS), as a source, may however not result in the desired compressive stress. The use of TEOS, for a PECVD silicon oxide layer, deposited at a temperature between about 350 to 450° C., to a thickness between about 17000 to 19000 Angstroms, using conventional power and frequent conditions, such as an initial power of about 800 to 1000 watts, at an initial frequency between about 13 to 14 MHz, followed by the use of a final power of about 0 to 600 watts, at a final frequency between about 100 to 400 Khz, results in a silicon oxide layer, with a compressive stress of only between about $-0.5$ to $-1.5E9$ dynes/cm$^2$. The compressive stress of this silicon oxide layer still may not be sufficient to overcome the tensile stress of silicon oxide layer 5, therefore a novel set of deposition conditions have been found, that result in a greater compressive stress, for IMD-3, or silicon oxide layer 6.

Figure 3:
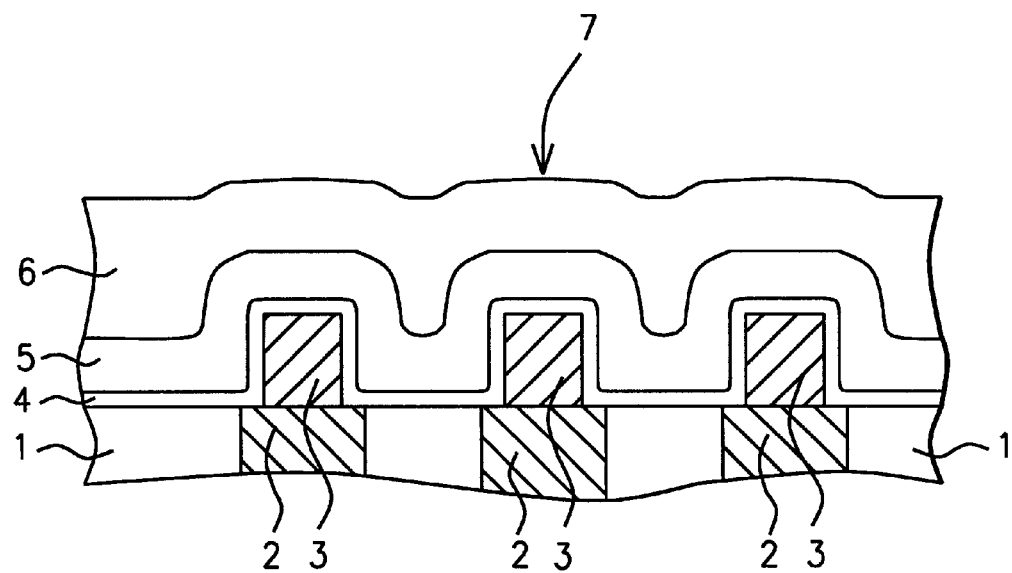

The PECVD procedure for silicon oxide layer 6, shown schematically in FIG. 3, resulting in the desired, or higher compresssive stress, used in this invention, is now described, again using TEOS as source. The deposition conditions for silicon oxide layer 6, are a deposition temperature between about 350 to 450° C., however using an initial power between about 700 to 1000 watts, at an initial frequency between about 13 to 14 MHz, then completing the deposition of silicon oxide layer 6, at a final power about 200 to 1000 watts, and at a final the frequency between about 100 to 400 KHz, resulting in a total thickness of silicon oxide layer 6, between about 17000 to 19000 Angstroms, however with a compressive stress of about $-2.0$ to $-3.0E9$ dynes/cm$^2$, or about 2.5 times higher than the compressive stress obtained using conventional power and frequency conditions. The composite IMD layer 7, is now comprised with less tensile stress, as a result of the high compressive stress, silicon oxide layer 6, formed using the deposition conditions described in this invention, balancing the total stress of composite IMD layer 7, which reduces the possibility of wafer warpage, which can accompanied by deleterious dielectric cracks, and metal opens. Table 1, summarizes the deposition mode, thickness, and the critical stress values. of the various IMD components.

While this invention has been particularly shown and described with reference to the preferred embodiments thereof, it will be understood by those skilled in the art that various changes in form and details may be made without departing from the spirit and scope of this invention.

What is claimed is:

1. A method of forming a composite intermetal dielectric, (IMD), layer, featuring low tensile stress, on a semiconductor substrate, comprising the steps of:

providing metal interconnect structures, overlying, and contacting, conductive regions, on, or in, said semiconductor substrate;

depositing a first silicon oxide layer on said metal interconnect structures, wherein said first silicon oxide layer is comprised with a compressive stress between about $-0.5$ to $1.5E8$ dynes/cm$^2$;

depositing a second silicon oxide layer on said first silicon oxide layer, wherein said second silicon oxide layer is comprised with a tensile stress between about 3.5 to 4.0E9 dynes/cm$^2$; and depositing a third silicon oxide layer on said second silicon oxide layer, wherein said third silicon oxide layer is deposited to a thickness between about 17000 to 19000 Angstroms, using an initial power between about 700 to 1000 watts, and an initial frequency between about 13 to 14 MHZ, then using a final power between about 200 to 1000 watts, at a final frequency between about 100 to 400 kHz, resulting in a compressive stress between about $-2.0$ to $-3.0E9$ dynes/cm$^2$ for said third silicon oxide layer.

2. The method of claim 1, wherein said conductive regions are either active device regions, in said semiconductor substrate, or metal plugs, or metal interconnect structures, encased in an insulator layer, and comprised of a metal chosen from a group that includes alumninum, tungsten, tungsten silicide, or copper.

3. The method of claim 1, wherein said metal interconnect structures are comprised of a metal chosen from a group that includes aluminum, aluminum—copper, tungsten, or copper.

4. The method of claim 1, wherein said first silicon oxide layer is deposited using plasma enhanced chemical vapor deposition, (PECVD), procedures, at a temperature between about 350 to 450° C., at a thickness between about 750 to 1250 Angstroms using silane and nitrous oxide as reactants, or using TEOS as a source.

5. The method of claim 1, wherein said second silicon oxide layer is deposited using sub-atmospheric chemical vapor deposition, (SACVD), procedures, to a thickness between about 3500 to 4500 Angstroms, at a temperature between about 350 to 450° C., using TEOS as a source.

6. The method of claim 1, wherein said third silicon oxide layer is deposited using PECVD procedures, to a thickness between about 17000 to 19000 Angstroms, at a temperature between about 350 to 450° C., using tetraethylorthosilicate, (TEOS), as a source.

7. A method of forming a composite IMD layer, on a semiconductor structure, featuring a capping, silicon oxide layer, that is formed using deposition conditions that result in a high compressive stress, needed to prevent dielectric layer, and metal interconnect structure defects, induced by tensile stress components of said composite IMD layer, comprising the steps of:

providing metal interconnect structures, overlying and contacting, conductive regions, on, or in, a semiconductor substrate;

depositing a thin, first silicon oxide layer on said metal interconnect structures wherein said thin, first silicon oxide layer is comprised with a compressive stress between about −0.5 to −1.5E8 dynes/cm$^2$;

depositing a second silicon oxide layer on said thin, first silicon oxide layer, via sub-atmospheric chemical vapor deposition, (SACVD), procedure, wherein said second silicon oxide layer is comprised with a tensile stress between about 3.5 to 4.0E9 dynes/cm$^2$; and depositing a thick, third silicon oxide layer on said second silicon oxide layer, wherein said thick, third silicon oxide layer, obtained via PECVD procedures, is deposited to a thickness between about 17000 to 19000 Angstroms, at a temperature between about 350 to 450° C., using TEOS as a source, using an initial power between about 700 to 1000 watts, at an initial frequency between about 13 to 14 MHZ, then using a final power between about 200 to 1000 watts, at a final frequency between about 100 to 400 KHz, and wherein said thick, third silicon oxide layer is comprised with a compressive stress between about −2.0 to −3.0E9 dynes/cm$^2$.

8. The method of claim 7, wherein said conductive regions in a semiconductor substrate, are active device regions, such as source/drain regions.

9. The method of claim 7, wherein said conductive regions located on a semiconductor substrate are either metal plug structures, or lower level metal interconnect structures, encased in an insulator layer, and comprised of a metal chosen from a group that includes aluminum, tungsten, tungsten silicide, or copper.

10. The method of claim 7, wherein said metal interconnect structures are comprised of a metal chosen from a group that contains aluminum, aluminum—copper, tungsten, or copper.

11. The method of claim 7, wherein said thin, first silicon oxide layer, is obtained via PECVD procedures, to a thickness between about 750 to 1250 Angstroms, at a temperature between about 350 to 450° C., using silane and nitrous oxide as reactants, or using TEOS as a source.

12. The method of claim 7, wherein said second silicon oxide layer, obtained via SACVD procedures, is deposited at a temperature between about 350 to 450° C., to a thickness between about 4500 to 5500 Angstroms.

* * * * *